(12) United States Patent
Moriwaki (10) Patent No.: US 11,769,765 B2
(45) Date of Patent: Sep. 26, 2023

(54) GATE DIELECTRIC LAYER PROTECTION

(71) Applicant: Micron Technology, Inc., Boise, ID (US)

(72) Inventor: Yoshikazu Moriwaki, Hiroshima (JP)

(73) Assignee: Micron Technology, Inc., Boise, ID (US)

( * ) Notice: Subject to any disclaimer, the term of this patent is extended or adjusted under 35 U.S.C. 154(b) by 144 days.

(21) Appl. No.: 17/202,207

(22) Filed: Mar. 15, 2021

(65) Prior Publication Data

US 2022/0293582 A1   Sep. 15, 2022

(51) Int. Cl.
*H01L 27/02* (2006.01)
*H01L 21/762* (2006.01)
*H01L 29/423* (2006.01)
*H01L 29/40* (2006.01)
*H01L 29/49* (2006.01)

(52) U.S. Cl.
CPC .... *H01L 27/0207* (2013.01); *H01L 21/76224* (2013.01); *H01L 29/401* (2013.01); *H01L 29/42364* (2013.01); *H01L 29/49* (2013.01)

(58) Field of Classification Search
CPC .......... H01L 27/0207; H01L 21/76224; H01L 29/401; H01L 29/42364; H01L 29/49
See application file for complete search history.

(56) References Cited

U.S. PATENT DOCUMENTS

2019/0013323 A1*  1/2019  Bhattacharyya .... H01L 29/4234

* cited by examiner

*Primary Examiner* — Julia Slutsker
(74) *Attorney, Agent, or Firm* — Dorsey & Whitney LLP (57) ABSTRACT

Apparatuses with a gate electrode in a semiconductor device are described. An example apparatus includes an active region, an isolation region surrounding the active region, a dielectric layer including a first portion above the active region and a second portion above the isolation region, and a protection layer on the isolation region.

17 Claims, 4 Drawing Sheets

GATE DIELECTRIC LAYER PROTECTION

BACKGROUND

Reduced chip size, high data reliability, reduced power consumption and efficient power usage are features that are demanded from semiconductor memory. Semiconductor devices, including semiconductor memory, are susceptible to local layout effects (LLEs). LLEs are layout dependent effects which change characteristics of transistors in the semiconductor device negatively due to the layout of the semiconductor device. For example, placements of certain circuits and/or components in the semiconductor device may cause LLEs. An example of a transistor-related LLE is the effect on threshold voltages (Vt) of transistors.

Some LLEs have been observed in semiconductor devices including High-k material with high relative permittivity in dielectric layers of gate electrodes that insulate conductive layers of the gate electrodes from active regions. Some of LLEs in such semiconductor devices are caused by direct exposure of the dielectric layer to isolation regions, such as shallow trench isolation (STI). The dielectric layers may absorb oxygen from the STI. This effect is particularly salient when the dielectric layers include the High-k material. By absorbing oxygen, threshold voltages (Vt) of transistors may change and performance of the transistors becomes uneven.

Various semiconductor structures have been developed to control exposure of a dielectric layer to STI as countermeasures to the LLEs. An example of one of such structure includes an extra metal layer above the transistors. The extra metal layer connects the gate electrodes of the transistors. The extra metal layer is separated from the STI by a number of conductive and dielectric layers of gate electrodes of the transistors that are disposed between the STI and the extra metal layer. Unlike the connection of conductive layers in the gate electrodes of the transistors, the connection by the extra metal layer prevents oxygen absorption by the dielectric layers of the gate electrodes from the STI. However, the extra metal layer above the transistors may increase parasitic capacitance. The parasitic capacitance exacerbates array efficiency and slows down memory access operations. Thus, different countermeasures to the LLEs may be desired.

DETAILED DESCRIPTION OF PREFERRED EMBODIMENTS

Various embodiments of the present disclosure will be explained below in detail with reference to the accompanying drawings. The following detailed description refers to the accompanying drawings that show, by way of illustration, specific aspects and embodiments in which the present disclosure may be practiced. These embodiments are described in sufficient detail to enable those skilled in the art to practice the present disclosure. Other embodiments may be utilized, and structure, logical and electrical changes may be made without departing from the scope of the present disclosure. The various embodiments disclosed herein are not necessary mutually exclusive, as some disclosed embodiments can be combined with one or more other disclosed embodiments to form new embodiments.

Embodiments of the present disclosure will be described with reference to FIG. 1 to FIG. 3. The following description uses a DRAM as an illustrative example of a semiconductor device. Furthermore, a complementary metal-oxide-semiconductor (CMOS) device is used as an illustrative example of the semiconductor device. In some embodiments, a semiconductor device may include a protection layer between an isolation region and a dielectric layer of a gate electrode on an active region. The protection layer may cover the isolation region and edges of active regions adjacent to the isolation region under the dielectric layer of the gate electrode. Because the dielectric layer is isolated from the isolation region by the protection layer, absorption of oxygen from the isolation region by the dielectric layer of the gate electrode may be prevented.

Figure 1:
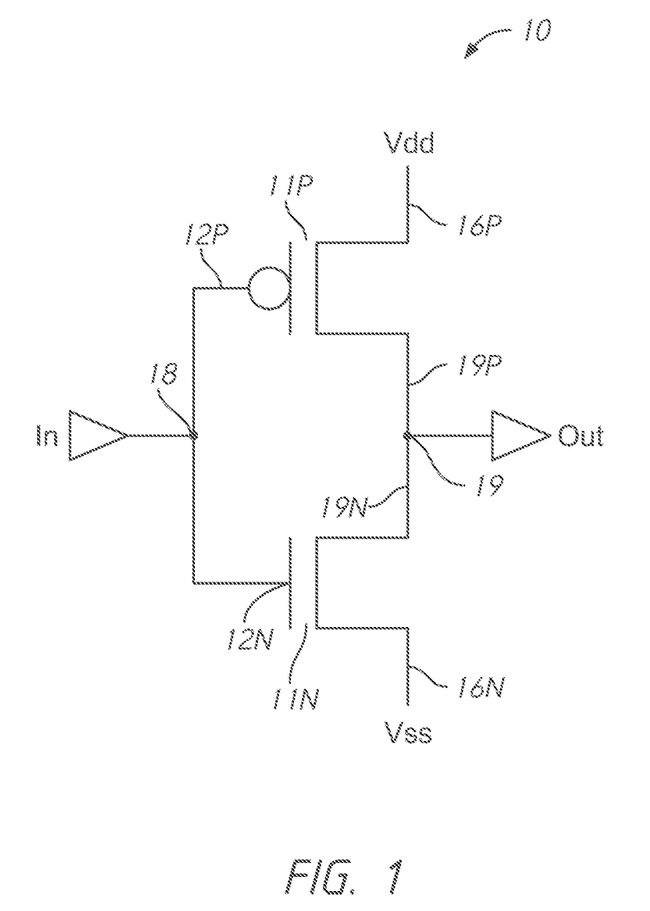
FIG. 1 is a circuit diagram of an inverter circuit according to an embodiment of the present disclosure.

FIG. 1 is a circuit diagram of an inverter circuit 10 according to an embodiment of the present disclosure. The inverter circuit 10 may include transistors 11P and 11N. In some embodiments of the present disclosure, the inverter circuit 10 may be a CMOS device. The transistor 11P is a transistor of a first type and the transistor 11N is a transistor of a second type that is of a different polarity from the polarity of the transistor 11P. For example, the transistor 11P of the first type may be a p-channel field effect transistor and the transistor 11N of the second type may be an n-channel field effect transistor. The transistor 11P may include a gate 12P. The transistor 11N may include a gate 12N. The gates 12P and 12N of the transistors 11P and 11N may be coupled to an input node In 18. The gates 12P and 12N of the transistors 11P and 11N may receive an input signal In from the input node 18. The transistor 11P and 12N may be coupled to an output node Out 19. A terminal 161 (typically, a source terminal) of the transistor 11P may be coupled to a power supply voltage line (e.g., Vdd) and a terminal 16N (typically, a source terminal) of the transistor 11N may be coupled to another power supply voltage line (e.g., Vss). One of the transistors 11P and 11N may be activated responsive to the input signal In from the input node In 18 and may provide an output signal to the output node Out 19 through either a terminal 19P (typically, a drain terminal) or a terminal 19N (typically, a drain terminal).

Figure 2:
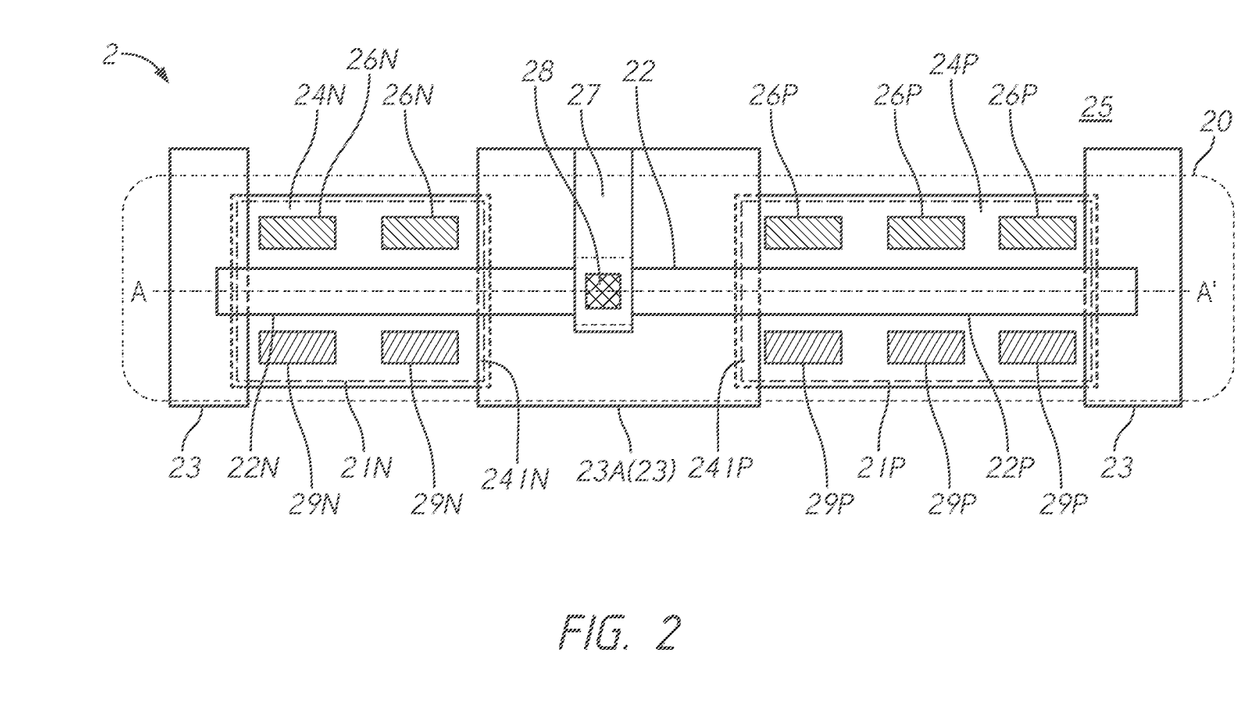
FIG. 2 is a simplified layout diagram of a semiconductor device according to an embodiment of the present disclosure.

FIG. 2 is a simplified layout diagram of a semiconductor device 2 according to an embodiment of the present disclosure. In some embodiments of the present disclosure, the semiconductor device 2 may be a CMOS device. In some embodiments, the semiconductor device 2 may include an inverter circuit 20. In some embodiments, the inverter circuit 20 may be used as the inverter circuit 10 in FIG. 1. The inverter circuit 20 may include transistors 21P) and 21N. The transistor 21P is a transistor of a first type. The transistor 21N is a transistor of a second type that is of a different polarity from the polarity of the transistor 21P. For example, the transistor 21P of the first type may be a p-channel field effect transistor and the transistor 21N of the second type may be an n-channel field effect transistor.

The transistor 21P may include an active region 24P, and the transistor 21N may include an active region 24N. In some embodiments, the active regions 24P and 24N may be portions of a semiconductor substrate. For example, the semiconductor substrate may include monocrystalline silicon. The inverter circuit 20 may also include a gate electrode 22. The gate electrode 22 may include gates 22P and 22N of the transistors 21P and 21N, respectively. The gate 22P may be disposed above the active region 24P and the gate 22N may be disposed above the active region 24N. The active region 24P' may include diffusion regions (e.g., source region and/or drain region) and a channel region (not shown) between the diffusion regions below the gate 22P. The active region 24N may include diffusion regions (e.g., source region and/or drain region) and a channel region (not shown) between the diffusion regions below the gate 22N. The transistor 21P may include the diffusion regions (e.g., source region and drain region) in the active region 24P and the gate 22P. The transistor 21N may include the diffusion regions (e.g., source region and drain region) in the active region 24N and the gate 22N.

In some embodiments, the gate electrode 22 may be disposed above the active regions 24P and 24N. The active regions 24P and 24N may be surrounded by an isolation region 25. In some embodiments, the isolation region 25 is shallow trench isolation (STI) surrounding the active regions 24P and 24N. The isolation region 25 may separate the active regions 24P and 24N from each other, although they may be connected below the STI structure. Thus, the isolation region 25 may separate the transistor 21P from the transistor 21N. In some embodiments, the isolation region 25 may include silicon oxide (SiO2), silicon nitride (Si3N4), silicon oxynitride (SiOxNy), a combination thereof, etc. The active regions 24P and 24N may be doped to provide the channel regions (not shown). In some embodiments, the active regions 24P and 24N may be doped with impurities, and followed by heat treatment. For example, the active region 24P may be doped with a P-type impurity, for example, boron (B). For example, the active region 24N may be doped with an N-type impurity, for example, phosphorus (P).

The transistors 21P and 21N may share a terminal 28. In some embodiments, the terminal 28 may be an input node In that receives an input signal. For example, the input node In may be the input node In 18 of FIG. 1. The transistors 21P and 21N may receive the input signal through the terminal 28. In some embodiments, the terminal 28 may be a conductive plug disposed on the gate electrode 22. In some embodiments, the conductive plug of the terminal 28 may include conductive material, such as metal. For example, the conductive plug of the terminal 28 may include copper (Cu) or the like. In some embodiments, the conductive plug of the terminal 28 may be a through-dielectric via (TDV) (e.g., through-dielectric conductor). The terminal 28 may be coupled to a conductive layer 27 that provides the input signal. In some embodiments, the conductive layer 27 may be disposed over the gate electrode 22. In some embodiments, the conductive layer 27 is a metal layer.

The transistor 21P may include one or more terminals 26P (typically, a source terminal) coupled to a power supply voltage line (e.g., Vdd). The transistor 21N may include one or more terminals 26N (typically, a source terminal) coupled to another power supply voltage line (e.g., Vss). In some embodiments, the terminals 26P and 26N may be conductive plugs disposed on one side (e.g., a side above the gate electrode 22 in FIG. 2) of the active regions 24P and 24N with respect to the gate electrode 22, respectively. The transistor 21P may include one or more terminals 29P. The transistor 21N may include one or more terminals 29N. The transistors 21P and 21N may be coupled to an output node Out (e.g., the output node Out 19 of FIG. 1) through the terminals 29P and 29N. In some embodiments, the terminals 29P and 29N may be conductive plugs disposed on another side (e.g., a side below the gate electrode 22 in FIG. 2) of the active regions 24P) and 24N with respect to the gate electrode 22, respectively.

The semiconductor device 2 may include protection layers 23 disposed above the isolation region 25. In some embodiments, the protection layers 23 may include a protection layer 23A that may be disposed on the isolation region 25 between the active regions 24P and 24N. In some embodiments, the protection layers 23 may isolate the gate electrode 22 from the isolation region 25. The protection layers 23 may include insulating material that may suppress oxygen permeability, such as silicon nitride (Si3N4), aluminum oxides (AlOx), silicon oxynitride (SiOxNy), etc. The protection layer 23A may be further disposed partially on the active region 24P at and/or around a border between the active region 24P and the isolation region 25 below the gate electrode 22. For example, the protection layer 23A may extend on an edge 241P of the active region 24P that is adjacent to the isolation region 25 and below the gate electrode 22. In some embodiments, the edge 241P may have a width of several or several tens of nanometers.

The protection layer 23A may be further disposed partially on the active region 24N at and/or around a border between the active region 24N and the isolation region 25 below the gate electrode 22. For example, the protection layer 23A may be extend on an edge 241N of the active region 24N that is adjacent to the isolation region 25 below the gate electrode 22. In some embodiments, the edge 241N may have a width of several or several tens of nanometers. The protection layers 23 may cover top surfaces of the isolation region 25 and edges (e.g., the edges 241P and 241N) of the active regions 24P and 24N adjacent to the isolation region 25. The gate electrode 22 may be disposed above the protection layers 23. The gate electrode 22 may be isolated from the isolation region 25 by the intervening protection layer 23. Because the protection layer 23A covers a surface of the isolation region 25 between the active regions 24P and 24N, and further covers the edges 241P and 241N, the protection layer 23A may prevent the gate electrode 22 on the protection layer 23A from absorbing oxygen from the isolation region 25.

Because the gate electrode 22 may be disposed as one component over the isolation region 25 separated by the protection layer 23A, there may be some advantages. For example, separate terminals with separate conductive plugs for the gates 22P and 22N may be omitted from the inverter circuit 20, and an extra conductive layer to couple the terminals for the gates 22P and 22N may be omitted. Omitting the extra conductive layer may reduce the parasitic capacitance. Furthermore, the conductive layers (e.g., a conductive layer 223 of the gate electrode 22 in FIG. 3) may be disposed over the isolation region 25 and the transistors 21P and 21N may share the terminal 28 which may be disposed on the gate electrode 22, without limiting locations of the conductive layer 223 and the terminal 28 above the transistors 21P and 21N. Thus, there may be flexibility in layout designs, such as patterns of the conductive layers 223 and 27 and a location of the terminal 28, which may result in area efficiency.

Figure 3:
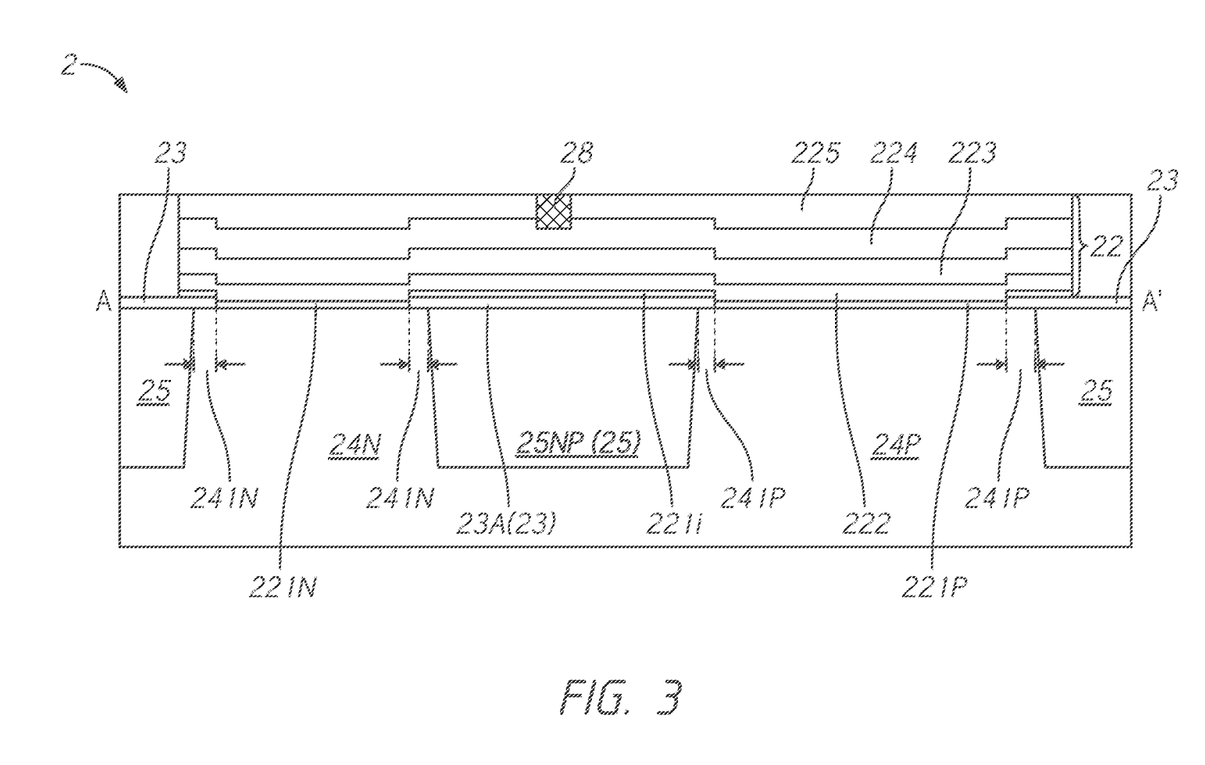
FIG. 3 is a schematic diagram illustrating a vertical cross-sectional view of a schematic structure of the semiconductor device.

FIG. 3 is a schematic diagram illustrating a vertical cross-sectional view of a schematic structure of the semiconductor device 2. In some embodiment, FIG. 3 may be a cross-sectional view showing the semiconductor device 2 along on a line A-A' shown in FIG. 2. That is, the cross-sectional view may show a portion of the semiconductor device 2 including an inverter circuit 20 including transistors 21P and 21N, a gate electrode 22, active regions 24P and 24N.

The semiconductor device 2 may include a semiconductor substrate 24. The semiconductor substrate 24 may be a silicon wafer including, for example, monocrystalline silicon. The isolation region 25 may be disposed on the semiconductor substrate 24. The isolation region 25 may include, for example, a shallow trench isolation (STI) structure. Using known lithography technology and anisotropic dry etching technology, etching trenches in the semiconductor substrate 24 may be performed. Then an insulating film may be deposited to fill the trenches. For example, the insulating film may include a silicon oxide (SiO2) film, a silicon nitride (Si3N4) film, a silicon oxynitride (SiOxNy) film, a combination thereof, etc. Thus, the isolation region 25 may be formed. The isolation region 25 may surround active regions 24N and 24P of the semiconductor substrate 24. Thus, the isolation region 25 may electrically isolate transistors formed on the semiconductor substrate 24. For example, the isolation region 25NP between the active regions 24N and 24P may electrically isolate transistors (e.g., the transistors 21N and 21P, respectively) formed on the active regions 24N and 24P of the semiconductor substrate 24.

The protection layers 23 may be disposed above the isolation region 25. In some embodiments, the protection layers 23 may include a protection layer 23A that may be disposed on a portion 25NP of the isolation region 25 between the active regions 24P and 24N. In some embodiments, the protection layers 23 may include silicon nitride (Si3N4). In some embodiments, the protection layers 23 may be further disposed partially on active regions and at and/or around borders between active regions and the isolation region 25 below the gate electrode 22. For example, the protection layer 23A may be further disposed partially on the active region 24P at and/or around a border between the active region 24P and the isolation region 25NP below the gate electrode 22. Thus, the protection layer 23A may extend on an edge 241P of the active region 24P that is adjacent to the isolation region 25NP below the gate electrode 22. In some embodiments, the edge 241P may have a width of several or several tens of nanometers.

The protection layer 23A may be further disposed partially on the active region 24N at and/or around a border between the active region 24N and the isolation region 25NP below the gate electrode 22. Thus, the protection layer 23A may extend on an edge 241N of the active region 24N that is adjacent to the isolation region 25NP below the gate electrode 22. In some embodiments, the edge 241N may have a width of several or several tens of nanometers.

The protection layers 23 may be formed or patterned on exposed surfaces of the isolation region 25. For example, the protection layers 23 may be formed by the chemical vapor deposition (CVD) or the atomic layer deposition (ALD). In some embodiments, the formation of the protection layers 23 may be followed by either dry etching or wet etching to remove the protection layers on the active regions 24P and 24N using photoresist masks. In some embodiments the protection layers 23 may be further formed or patterned on edges (e.g., the edges 241P and 241N) of the active regions 24P and 24N adjacent to the isolation region 25. In some embodiments, forming the protection layers 23 may be performed separately from forming the isolation region 25. In some embodiments, forming the protection layers 23 may be performed after forming the isolation region 25. For example, the protection layers 23 may be formed on the exposed surface of the isolation region 25 and the edges 241P and 241N of the active regions 24P and 24N adjacent to the isolation region 25NP. The protection layers 23 may be an insulating film. The insulating film may include a silicon nitride film (Si3N4) for example.

In some embodiments, the gate electrode 22 may be disposed above the protection layers 23 and exposed surfaces of active regions between the protection layers 23. For example, the gate electrode 22 may be formed or patterned on an exposed surface of the active region 24P between the protection layer 23A and another protection layer 23 partially on the active region 24P. The gate electrode 22 may be formed or patterned on an exposed surface of the active region 24N between the protection layer 23A and another protection layer 23 partially on the active region 24N.

The gate electrode 22 may include multiple layers. In some embodiments, the gate electrode 22 may include dielectric layers 221. The dielectric layers 221 may include dielectric layer 221P, 221*i* and 221N. The dielectric layers 221 may be disposed on protection layers 23 and exposed surfaces of active regions between the protection layers 23. For example, the dielectric layer 221P may be disposed on an exposed surface of the active region 24P between the edges 241P. The dielectric layer 221N may be disposed on an exposed surface of the active region 24N between the edges 241N. The dielectric layer 221*i* may be disposed on the protection layer 23A. In some embodiments, the dielectric layers 221P, 221*i* and 221N may be formed as one film. The dielectric layer 221*i* may have an elevation that is higher than an elevation of the dielectric layers by a thickness of the protection layer 23A. The dielectric layers 221 may include high-k material with high relative permittivity. The High-k material may include, oxidized material containing transition metal and the like. For example, the transition metal may be any one of, for example, yttrium (Y), titanium (Ti), zirconium (Zr), hafnium (Hf), niobium (Nb), or tantalum (Ta).

In some embodiments, the gate electrode 22 may include a conductive layer 222. In some embodiments, as shown in FIG. 3, the conductive layer 222 may be disposed on the dielectric layers 221P, 221*i* and 221N. A portion of the conductive layer 222 on the dielectric layer 221*i* may have an elevation that is higher than an elevation of portions of the conductive layer 222 on the dielectric layers 221P and 221N by the thickness of the protection layer 23A. The conductive layer 222 may be one or more metal layers. In some embodiments, the conductive layer 222 may be used to control a work function of the conductive layer 222. The conductive layer 222 may include metal material, for example, titanium nitride (TiN), tantalum nitride (TaN), titanium aluminum nitride (TiAlN), etc. In some embodiments, the conductive layer 222 may be formed as one film. For example, the conductive layer 222 may be formed by chemical vapor deposition (CVD).

In some embodiments, the gate electrode 22 may include a conductive layer 223. The conductive layer 222 may include, for example, polycrystalline silicon (poly-Si). In some embodiments, as shown in FIG. 3, the conductive layer 223 may be disposed on the conductive layer 222. The conductive layer 223 may be doped with an impurity, for example, phosphorus (P), arsenic (As) or boron (B). In some embodiments, the impurity may be an N-type impurity such as phosphorus (P) or arsenic (As). In some embodiments, the impurity may be a P-type impurity such as Boron (B). In some embodiments, the conductive layer 223 may be formed by a poly-Si layer deposition by CVD. For example, the poly-Si layer deposition with doping of phosphorus can be performed to form an impurity concentration film in the gate electrode 22. When high doping of phosphorus is performed, a high impurity concentration film may be formed as the conductive layer 223. When low doping of phosphorus is performed, a low impurity concentration film may be formed as the conductive layer 223. In some embodiments, the impurity may be doped as a post-deposition step. In some embodiments, the gate electrode 22 may include a conductive layer 224. The conductive layer 224 may be one or more metal layers. For example, the one or more metal layers may include tungsten (W), tungsten nitride (WN), titanium nitride (TiN), titanium (Ti), etc. In some embodiments, the conductive layer 224 may be formed by CVD.

In some embodiments, the gate electrode 22 may include a dielectric layer 225 on the conductive layer 224. The dielectric layer 225 may be an insulating film. For example, the insulating film may include a silicon oxide (SiO2) film, a silicon nitride (Si3N4) film, a silicon oxynitride (SiOxNy) film, a combination thereof, etc. In some embodiments, the dielectric layer 225 may be formed by CVD. The terminal 28 may be a conductive plug disposed on the gate electrode 22. In some embodiments, the terminal 28 may be above the protection layer 23A. The terminal 28 may be electrically coupled to the conductive layer 224. The terminal 28 may be disposed through the dielectric layer 225 to be physically in contact with the conductive layer 224. In some embodiments, the conductive plug of the terminal 28 may include conductive material, such as metal. For example, the conductive plug of the terminal 28 may include copper (Cu) or the like. In some embodiments, the conductive plug of the terminal 28 may be a through-dielectric via (TDV) (e.g., through-dielectric conductor).

The gate electrode 22 may be isolated from the isolation region 25NP by the intervening protection layer 23A between the dielectric layer 221*i* and the isolation region 25NP. Because the protection layer 23A covers the isolation region 25NP between the active regions 24P and 24N and covers the edges 241P and 241N, the dielectric layer 221*i* of the gate electrode 22 may not be exposed to the isolation region 25NP. A portion of the dielectric layer 221*i* above the isolation region 25NP may be separated from the isolation region 25NP because of the protection layer 23A that is between the dielectric layer 221*i* and the isolation region 25NP. A portion of the dielectric layer 221*i* above the edges 241P and 241N of the active regions 24P and 24N may be separated from the isolation region 25NP, because of the protection layer 23A disposed between the dielectric layer 221*i* and edges 241P and 241N. Thus, the protection layer 23A may prevent the dielectric layer 221*i* of the gate electrode 22 on the protection layer 23A from absorbing oxygen from the isolation region 25NP. The dielectric layers 221P and 221N are not in proximity to the isolation region 25NP, unlike the dielectric layer 221*i*. The dielectric layers 221P and 221N are separated from the isolation region 25NP by the edges 241P and 241N. Oxygen absorption by the dielectric layers 221P and 221N is of less concern. Similarly, the dielectric layer 221 above the other edges 241P and 241N away from the isolation region 25NP, still in proximity to the other isolation regions 25 may be prevented from absorbing oxygen from the other isolation regions 25, because the other isolation regions 25 and adjacent edges 241P and 241N in contact with the other isolation regions may be covered by the other protection layers 23.

Figure 4:
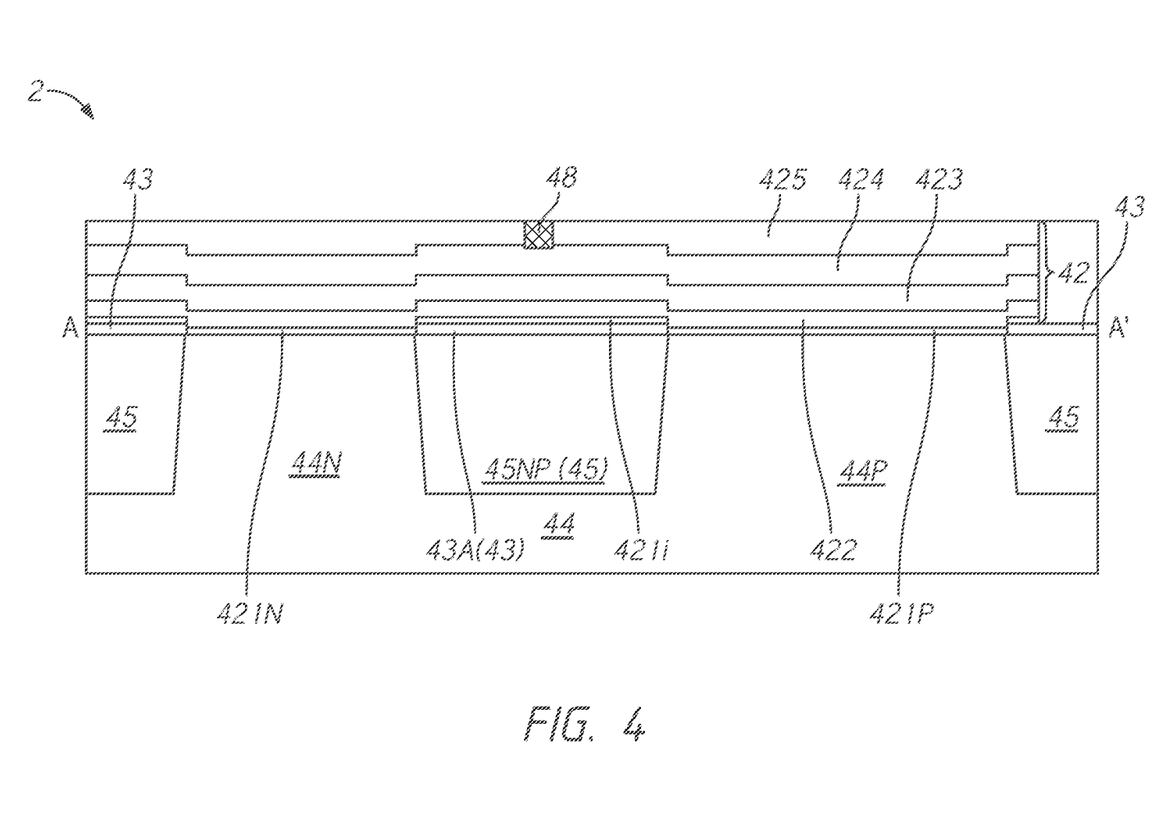
FIG. 4 is a schematic diagram illustrating a vertical cross-sectional view of a schematic structure of a semiconductor device according to an embodiment of the present disclosure.

FIG. 4 is a schematic diagram illustrating a vertical cross-sectional view of a schematic structure of a semiconductor device 4 according to an embodiment of the present disclosure. The semiconductor device 4 may include a semiconductor substrate 44. The semiconductor substrate 44 may be a silicon wafer including, for example, monocrystalline silicon. An isolation region 45 may be disposed on the semiconductor substrate 44. The isolation region 45 may include, for example, a shallow trench isolation (STI) structure. Using known lithography technology and anisotropic dry etching technology, etching trenches in the semiconductor substrate 44 may be performed. Then an insulating film may be deposited to fill the trenches. For example, the insulating film may include a silicon oxide (SiO2) film, a silicon nitride (Si3N4) film, a silicon oxynitride (SiOxNy) film, a combination thereof, etc. Thus, the isolation region 45 may be formed. The isolation region 45 may surround active regions 44N and 44P of the semiconductor substrate 44. Thus, the isolation region 45 may electrically isolate transistors formed on the semiconductor substrate 44. For example, an isolation region 45NP between the active regions 44N and 44P may electrically isolate transistors formed on the active regions 44N and 44P of the semiconductor substrate 44.

Protection layers 43 may be disposed above the isolation region 45. In some embodiments, the protection layers 43 may include a protection layer 43A that may be disposed on a portion 45NP of the isolation region 45 between the active regions 44P and 44N. In some embodiments, the protection layers 43 may include silicon nitride (Si3N4). In some embodiments, the protection layers 43 may extend on the isolation region 45 and below the gate electrode 42. For example, the protection layer 43A may extend to borders of the isolation region 45NP and active regions 44P and 44N, on the isolation region 45NP below the gate electrode 42.

The protection layers 43 may be formed or patterned on exposed surfaces of the isolation region 45. For example, the protection layers 43 may be formed by the chemical vapor deposition (CVD) or the atomic layer deposition (ALD). In some embodiments, the formation of the protection layers 43 may be followed by either dry etching or wet etching to remove the protection layers on the active regions 44P and 44N using photoresist masks. In some embodiments, forming the protection layers 43 may be performed separately from forming the isolation region 44. In some embodiments, forming the protection layers 43 may be performed after forming the isolation region 44. The protection layers 43 may be an insulating film. The insulating film may include a silicon nitride film (Si3N4) for example.

In some embodiments, the gate electrode 42 may be disposed above the protection layers 43 and exposed surfaces of active regions between the protection layers 43. For example, the gate electrode 42 may be formed or patterned on an exposed surface of the active region 44P between the protection layer 43A and another protection layer 43. The gate electrode 42 may be formed or patterned on an exposed surface of the active region 44N between the protection layer 43A and another protection layer 43.

The gate electrode 42 may include multiple layers. In some embodiments, the gate electrode 42 may include dielectric layers 421. The dielectric layers 421 may include dielectric layer 421P, 421*i* and 421N. The dielectric layers 421 may be disposed on protection layers 43 and exposed surfaces of active regions between the protection layers 43. For example, the dielectric layer 421P may be disposed on an exposed surface of the active region 44P. The dielectric layer 421N may be disposed on an exposed surface of the active region 44N. The dielectric layer 421*i* may be disposed on the protection layer 43A. In some embodiments, the dielectric layers 421P, 421i and 421N may be formed as one film. The dielectric layer 421i may have an elevation that is higher than an elevation of the dielectric layers by a thickness of the protection layer 43A. The dielectric layers 421 may include high-k material with high relative permittivity. The High-k material may include, oxidized material containing transition metal and the like. For example, the transition metal may be any one of, for example, yttrium (Y), titanium (Ti), zirconium (Zr), hafnium (Hf), niobium (Nb), or tantalum (Ta).

In some embodiments, the gate electrode 42 may include a conductive layer 422. In some embodiments, as shown in FIG. 3, the conductive layer 422 may be disposed on the dielectric layers 421P, 421i and 421N. A portion of the conductive layer 422 on the dielectric layer 421i may have an elevation that is higher than an elevation of portions of the conductive layer 422 on the dielectric layers 421P and 421N by the thickness of the protection layer 43A. The conductive layer 422 may be one or more metal layers. In some embodiments, the conductive layer 422 may be used to control a work function of the conductive layer 422. The conductive layer 422 may include, for example, titanium nitride (TiN), tantalum nitride (TaN), titanium aluminum nitride (TiAlN), etc. In some embodiments, the conductive layer 422 may be formed as one film. For example, the conductive layer 422 may be formed by chemical vapor deposition (CVD).

In some embodiments, the gate electrode 42 may include a conductive layer 423. The conductive layer 422 may include, for example, polycrystalline silicon (poly-Si). In some embodiments, as shown in FIG. 3, the conductive layer 423 may be disposed on the conductive layer 422. The conductive layer 423 may be doped with an impurity, for example, phosphorus (P), arsenic (As) or boron (B). In some embodiments, the impurity may be an N-type impurity such as phosphorus (P) or arsenic (As). In some embodiments, the impurity may be a P-type impurity such as Boron (B). In some embodiments, the conductive layer 423 may be formed by a poly-Si layer deposition by CVD. For example, the poly-Si layer deposition with doping of phosphorus can be performed to form an impurity concentration film in the gate electrode 42. When high doping of phosphorus is performed, a high impurity concentration film may be formed as the conductive layer 423. When low doping of phosphorus is performed, a low impurity concentration film may be formed as the conductive layer 423. In some embodiments, the impurity may be doped as a post-deposition step. In some embodiments, the gate electrode 42 may include a conductive layer 424. The conductive layer 424 may be one or more metal layers. For example, the one or more metal layers may include tungsten (W), tungsten nitride (WN), titanium nitride (TiN), titanium (Ti), etc. In some embodiments, the conductive layer 424 may be formed by CVD.

In some embodiments, the gate electrode 42 may include a dielectric layer 425 on the conductive layer 424. The dielectric layer 425 may be an insulating film. For example, the insulating film may include a silicon oxide (SiO2) film, a silicon nitride (Si3N4) film, a silicon oxynitride (SiOxNy) film, a combination thereof, etc. In some embodiments, the dielectric layer 425 may be formed by CVD. The terminal 48 may be a conductive plug disposed on the gate electrode 42. In some embodiments, the terminal 48 may be above the protection layer 43A. The terminal 48 may be electrically coupled to the conductive layer 424. The terminal 48 may be disposed through the dielectric layer 425 to be physically in contact with the conductive layer 424. In some embodiments, the conductive plug of the terminal 48 may include conductive material, such as metal. For example, the conductive plug of the terminal 48 may include copper (Cu) or the like. In some embodiments, the conductive plug of the terminal 48 may be a through-dielectric via (TDV) (e.g., through-dielectric conductor).

The gate electrode 42 may be isolated from the isolation region 45 by the intervening protection layers 43A between the dielectric layer 421i and the isolation region 45NP. Because the protection layer 43A covers the isolation region 45NP between the active regions 44P and 44N, the dielectric layer 421i of the gate electrode 42 may not be exposed to the isolation region 45NP. A portion of the dielectric layer 421i above the isolation region 45NP may be separated from the isolation region 45NP because of the protection layer 43A that is between the dielectric layer 421i and the isolation region 45N P. Thus, the protection layer 43A may prevent the dielectric layer 421i of the gate electrode 42 on the protection layer 43A from absorbing oxygen from the isolation region 45NP. The dielectric layers 421P and 421N are not in proximity to the isolation region 45NP, unlike the dielectric layer 421i. The dielectric layers 421P and 421N are not substantively exposed to the isolation region 45NP or the other isolation regions 45 because the other isolation regions 45 may be covered by the other protection layers 43. Thus, oxygen absorption from the isolation regions 45 by the dielectric layers 421P, 421N and 421i may be prevented.

In the embodiments described above, a CMOS device including a combination of p-channel field effect transistor and n-channel field effect transistor is described as an example of the semiconductor device 2 according to various embodiments, but the above description is merely one example and not intended to be limited to CMOS devices. Semiconductor devices other than CMOS including a plurality of metal-oxide-semiconductor field-effect transistors (MOSFETs), such as a plurality of p-channel field effect transistors, a plurality of n-channel field effect transistors, or a mixture of p-channel and n-channel transistors, for example can also be applied as the semiconductor device 2.

As above, DRAM is described as an example of the semiconductor device 2 according to various embodiments, but the above description is merely one example and not intended to be limited to DRAM. Memory devices other than DRAM, such as static random-access memory (SRAM), flash memory, erasable programmable read-only memory (EPROM), magnetoresistive random-access memory (MRAM), and phase-change memory for example can also be applied as the semiconductor device 2. Furthermore, devices other than memory, including logic ICs such as a microprocessor and an application-specific integrated circuit (ASIC) for example are also applicable as the semiconductor device 2 according to the foregoing embodiments.

Although various embodiments of the disclosure have been disclosed, it will be understood by those skilled in the art that the embodiments extend beyond the specifically disclosed embodiments to other alternative embodiments and/or uses and obvious modifications and equivalents thereof. In addition, other modifications which are within the scope of this disclosure will be readily apparent to those of skill in the art based on this disclosure. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying mode of the disclosed embodiments. Thus, it is intended that the scope of at least some of the present disclosure should not be limited by the particular disclosed embodiments described above.

What is claimed is:

1. An apparatus comprising:
an active region;
an isolation region surrounding the active region;
a dielectric layer including a first portion above the active region and a second portion above the isolation region; and
a protection layer between the isolation region and the dielectric layer, wherein an elevation of the second portion of the dielectric layer is higher than an elevation of the first portion of the dielectric layer.

2. The apparatus of claim 1, wherein the active region comprises an edge adjacent to the isolation region, and
wherein a portion of the protection layer is further disposed between the edge and the dielectric layer.

3. The apparatus of claim 1, wherein the protection layer comprises insulating material.

4. The apparatus of claim 3, wherein the insulating material comprises silicon nitride.

5. The apparatus of claim 1, wherein the dielectric layer comprises high-k material.

6. The apparatus of claim 5, wherein the dielectric layer comprises any one of yttrium (Y), titanium (Ti), zirconium (Zr), hafnium (Hf), niobium (Nb) or tantalum (Ta).

7. An apparatus comprising:
a first transistor including:
a first gate; and
a first active region;
a second transistor including:
a second gate; and
a second active region;
a gate electrode including the first gate of the first transistor and the second gate of the second transistor;
an isolation region between the first active region and the second active region; and
a protection layer disposed between the isolation region and the gate electrode,
wherein the first active region comprises a first edge adjacent to a first side of the isolation region and the second active region comprises a second edge adjacent to a second side of the isolation region,
wherein the second side is opposite the first side,
wherein the protection layer is configured to extend across the isolation region from the first side of the first active region to the second side of the second active region, and
wherein the protection layer is configured to cover an entirety of the isolation region.

8. The apparatus of claim 7,
wherein the protection layer is further disposed between the gate electrode and the first edge, and
wherein the protection layer is further disposed between the gate electrode and the second edge.

9. The apparatus of claim 7, wherein the gate electrode comprises a dielectric layer on the protection layer.

10. The apparatus of claim 9, wherein the protection layer is configured to separate the dielectric layer from the isolation region.

11. The apparatus of claim 9, wherein the gate electrode comprises:
a conductive layer above the dielectric layer; and
a terminal electrically coupled to the conductive layer and configured to receive an input signal,
wherein the first transistor and the second transistor are configured to receive the input signal through the terminal.

12. The apparatus of claim 11, wherein the conductive layer comprises a portion above the protection layer.

13. The apparatus of claim 11, wherein the conductive layer comprises any one of titanium nitride, polycrystalline silicon or tungsten.

14. The apparatus of claim 11, wherein the terminal is disposed over the protection layer.

15. The apparatus of claim 14, further comprising another conductive layer coupled to the terminal, the other conductive layer configured to provide the input signal to the terminal,
wherein the other conductive layer is over the isolation region.

16. The apparatus of claim 15, wherein the gate electrode further comprises another dielectric layer, and
wherein the other conductive layer is above the other dielectric layer.

17. The apparatus of claim 1, wherein the elevation of the second portion of the dielectric layer is higher than the elevation of the first portion of the dielectric layer by a thickness of the protection layer.

* * * * *